United States Patent
Park et al.

(10) Patent No.: US 7,031,210 B2
(45) Date of Patent: Apr. 18, 2006

(54) METHOD OF MEASURING THRESHOLD VOLTAGE FOR A NAND FLASH MEMORY DEVICE

(75) Inventors: Jin Su Park, Daegu-Shi (KR); Doe Cook Kim, Daegu-Shi (KR)

(73) Assignee: Hynix Semiconductor Inc., Kyungki-Do (KR)

(*) Notice: Subject to any disclaimer, the term of this patent is extended or adjusted under 35 U.S.C. 154(b) by 123 days.

(21) Appl. No.: 10/879,540

(22) Filed: Jun. 29, 2004

(65) Prior Publication Data

US 2005/0105333 A1    May 19, 2005

(30) Foreign Application Priority Data

Nov. 18, 2003    (KR) .................. 10-2003-0081714

(51) Int. Cl.
G11C 29/00    (2006.01)
G11C 7/00    (2006.01)

(52) U.S. Cl. ............. 365/201; 365/185.01; 365/185.18

(58) Field of Classification Search ...................... None
See application file for complete search history.

(56) References Cited

U.S. PATENT DOCUMENTS

| 6,097,638 | A * | 8/2000 | Himeno et al. | ........ 365/185.25 |
| 6,614,688 | B1 * | 9/2003 | Jeong et al. | ........... 365/185.18 |
| 6,717,861 | B1 * | 4/2004 | Jeong et al. | ........... 365/185.28 |

* cited by examiner

*Primary Examiner*—Amir Zarabian
*Assistant Examiner*—Kretelia Graham
(74) *Attorney, Agent, or Firm*—Marshall, Gerstein & Borun LLP

(57) ABSTRACT

Provided is a method of measuring threshold voltages in a NAND flash memory device. In the method, a test voltage is applied to a wordline of selected memory cells to measure a distribution profile of threshold voltages of memory cells. A voltage summing up a pass voltage and an operation voltage is applied to wordlines of deselected cells. The operation voltage is applied to a well and a common source line. A voltage summing up a precharge voltage and the operation voltage is applied to a bitline. After then, a voltage variation on the bitline can be detected to measure a threshold voltage of a memory cell. A negative threshold voltage can be measured by applying a positive voltage with reference to a voltage, as the threshold voltage of the memory cell, set by subtracting the operation voltage from the test voltage in accordance with the bitline voltage variation.

6 Claims, 4 Drawing Sheets

METHOD OF MEASURING THRESHOLD VOLTAGE FOR A NAND FLASH MEMORY DEVICE

BACKGROUND

1. Field of the Invention

The present invention relates to a method of measuring threshold voltages of a NAND flash memory device, and specifically, to a method of measuring a negative threshold voltage of an erased memory cell.

2. Discussion of Related Art

In a NAND flash memory cell, threshold voltages of programmed memory cells distribute in the range of positive voltages higher than 0V, while threshold voltages of erased memory cells distribute in the range of negative voltages lower than 0V. For a NAND flash memory device, it is very important to measure distribution profiles of such threshold voltages in evaluating the reliability of memory cells.

The NAND flash memory device needs wordline drivers constructed of NMOS transistors only in order to applying high voltages over 16V for programming the memory cells. However, the wordline drivers are incapable of transferring negative voltages to the wordlines. Therefore, as it is just available to use only positive voltages with the wordline drivers, there are high difficulties to obtain distribution profiles of threshold voltages of erased memory cells.

SUMMARY OF THE INVENTION

The present invention is directed to a method of measuring distribution profiles of negative threshold voltages, in which threshold voltages of erased memory cells are evaluated after applying a voltage over 0V to a wordline of a memory cell instead of a negative voltage and establishing a gate-to-source voltage of the memory cell on a negative voltage by raising voltages of drain, source, and well of the memory cell by a predetermined voltage level.

One aspect of the present invention is to provide a method of measuring threshold voltages in a NAND flash memory device including a plurality of cell strings each having a plurality of memory cells connected in series, common drain nodes of the cell strings, common source nodes of the cell strings, wordlines for selecting the memory cells, and a well of a semiconductor substrate in which the memory cell is formed, the method comprising the steps of: applying an operation voltage to the well and the common source nodes; applying a test voltage, which is assigned to measure a threshold voltage, to the wordline of a selected memory cell; applying a voltage, which is obtained by summing up a pass voltage and an operation voltage, to the wordlines of deselected memory cells; applying a voltage, which is obtained by summing up a precharge voltage and the operation voltage, to the common drain node; and detecting a variation of voltage at the common drain node.

In another aspect of the present invention, a method of measuring threshold voltages, in a NAND flash memory device including a plurality of cell strings each having a plurality of memory cells connected in series, a plurality of bitlines connected to common drain nodes of the cell strings, a common source line connected to common source nodes of the cell strings, wordlines intersecting the bitlines so as to select the memory cells, and a well of a semiconductor substrate in which the memory cell is formed, is comprised of: applying an operation voltage to the well; applying a voltage, which is obtained by summing up a precharge voltage and the operation voltage, to the bitline, applying a test voltage to a selected wordline, applying a voltage, which is obtained by summing up a pass voltage and the operation voltage, to deselected wordlines, and applying the operation voltage to the common source line; and identifying, after detecting a voltage variation of the bitline during a read operation, a threshold voltage of a selected memory cell as a value obtained by subtracting the operation voltage from the test voltage when there is no voltage variation on the bitline, while increasing the test voltage by a predetermined level when the voltage of the bitline decreases.

Preferably in this embodiment, the test voltage is 0V through 10V; the operation voltage is 3V through 4V; the pass voltage is 4V through 6V; and the precharge voltage is 1V through 2V.

Preferably in this embodiment, the voltage obtained by summing up the precharge voltage and the operation voltage is applied to the common drain node through a virtual power input terminal to initiate the common drain node.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

Figure 1:
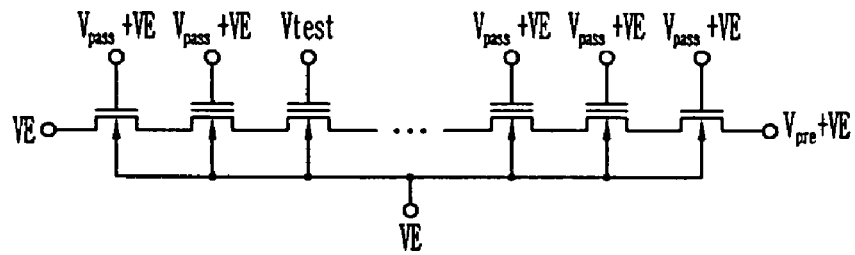
FIG. 1 is a schematic diagram illustrating a method for measuring a threshold voltage in a NAND flash memory device in accordance with the present invention.

FIG. 1 is a schematic diagram illustrating a method for measuring a threshold voltage in a NAND flash memory device in accordance with the present invention.

Referring to FIG. 1, the NAND flash memory device includes a plurality of cell strings each of which is composed of a plurality of memory cells connected in series therein, a common drain node of the cell string, a common source node of the cell string, wordlines selecting the memory cells each by each, and a well of a semiconductor substrate where the memory cells are formed. A operation voltage VE is applied to the well and the common source node. A test voltage Vtest is applied to a wordline of a selected memory cell in order to evaluate its threshold voltage, while a voltage Vpass+VE summing up a pass voltage Vpass and the operation voltage VE is applied to deselected wordlines. The common drain node is coupled to a voltage Vpre+VE summing up a precharge voltage Vpre and the operation voltage VE in order to the threshold voltage of the selected memory cell.

It is desirable to evaluate the threshold voltage of the selected memory cells through a variation of the voltage Vpre+VE, which is applied to the common drain node (i.e., a bitline), with gradually increasing the test voltage Vtest up to a predetermined voltage level from 0V. If there is no variation of voltage at the common drain node, it is required to increase the test voltage Vtest higher than its previous voltage level by ΔV. If the voltage of the common drain node, Vpre+VE, begins to vary, it is preferred to regard the voltage value Vtest−VE, which is obtained by subtracting the operation voltage VE from the test voltage Vtest at that time, as the threshold voltage of the selected memory cell.

As a gate-to-source voltage Vgs is set by subtracting the operation voltage VE from the test voltage Vtest, it is possible to evaluate a negative threshold voltage so that the gate-to-source voltage Vgs goes to a negative value when the test voltage Vtest is lower than the operation voltage VE. When the test voltage Vtest is applied with being higher than the operation voltage VE, the gate-to-source voltage Vgs has a positive value to enable a positive threshold voltage to be measured. It is desired for the operation voltage VE to be with an absolute value of the minimum threshold voltage of an erased cell.

The test voltage Vtest is preferred to be 0V through 10V, while the operation voltage VE is preferred to be 3V through 4V. The pass voltage Vpass is effective to use 4V through 6V, while the precharge voltage Vpre is effective to use 1V through 2V.

Figure 2:
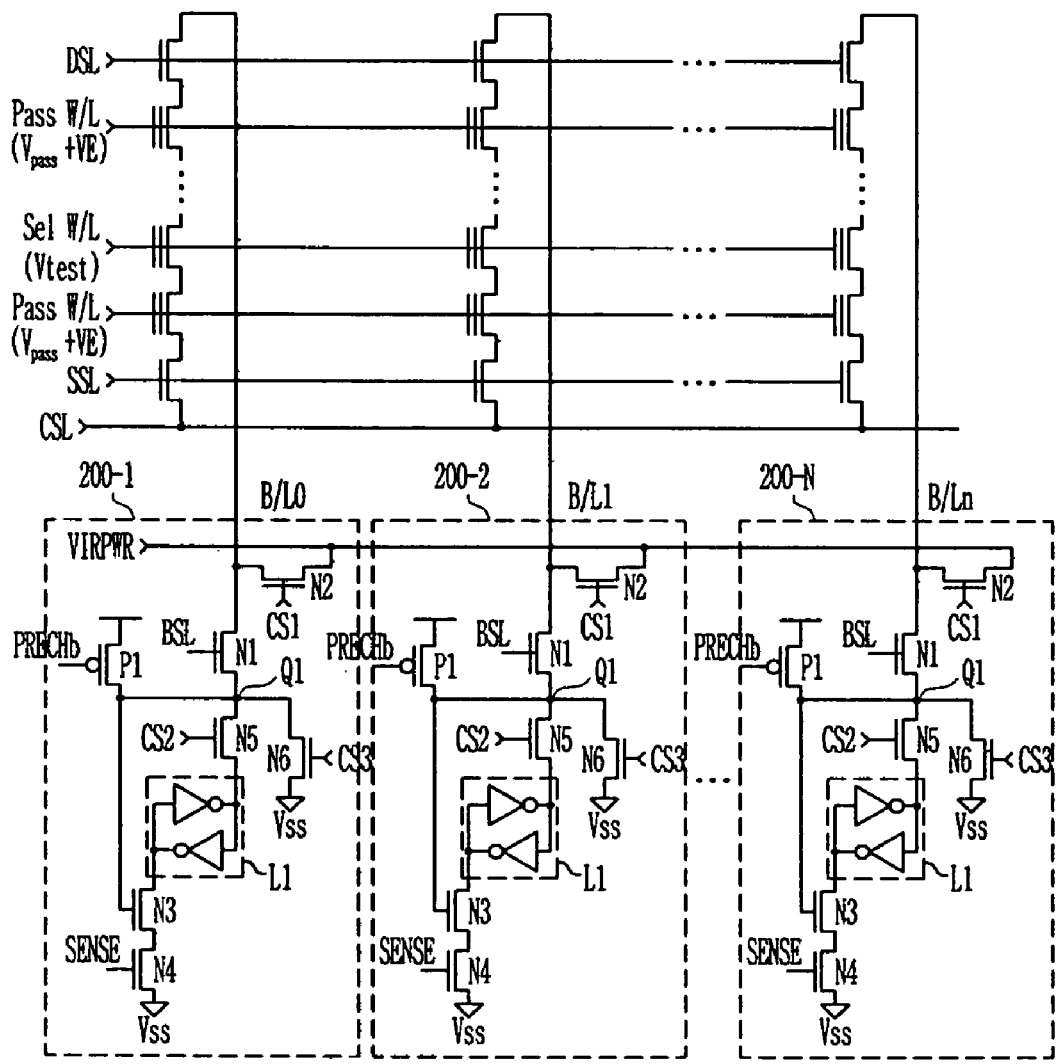
FIG. 2 is a circuit diagram of a flash memory device in accordance with the present invention.

FIG. 2 is a circuit diagram of a flash memory device in accordance with the present invention.

Referring to FIG. 2, the flash memory device is comprised of a plurality of cell strings each of which has a plurality of memory cells connected in series therein, a plurality of bitlines B/L connected to common drain nodes of the cell strings so as to select the cell strings, a common source line CSL connected to common source nodes of the cell strings, a plurality of wordlines intersecting the bitlines so as to select each of the memory cells, and a plurality of page buffers connected to the bitlines respectively so as to sense and latch data of a selected memory cell.

The page buffer 200 is comprised of a first NMOS transistor N1 connected between the bitline B/L and a first node Q1 and controlled by a bitline selection signal BSL, a second NMOS transistor N2 to apply a high voltage to the bitline B/L in response to a first control signal CS1, a first PMOS transistor P1 to apply a first voltage to the first node Q1 in response to a precharge enable signal PRECHb, a first latch L1 to sense and latch data of the memory cell, third and fourth NMOS transistors, N3 and N4, that are connected between an input terminal of the first latch L1 and a ground voltage Vss in series and controlled respectively by a state of the first node Q1 and a sensing signal SENSE, a fifth NMOS transistor N5 connected between the first node and the other input terminal of the first latch L1 and driven by a second control signal CS2, and a sixth NMOS transistor N6 connected between the first node Q1 and the ground voltage Vss so as to initiate the first node Q1 in response to a third control signal CS3.

The first control signal CS1, as a signal to initiate the bitline, controls the second NMOS transistor N2 to supply the ground voltage to the bitline in a read mode and to supply the power source voltage to the bitline in a program mode. In this embodiment, it is properly available to apply an operation voltage of a high level to the bitline by way of the second NMOS transistor N2 connected between a virtual power input terminal VIRPWR and the bitline, as well. The first voltage, meaning the power source voltage, is preferred to use an internal power within the flash memory device.

Hereinafter, it will be described about an exemplary method for measuring distribution profiles of threshold voltages in the flash memory device with reference to the timing diagram of FIG. 3.

Figure 3:
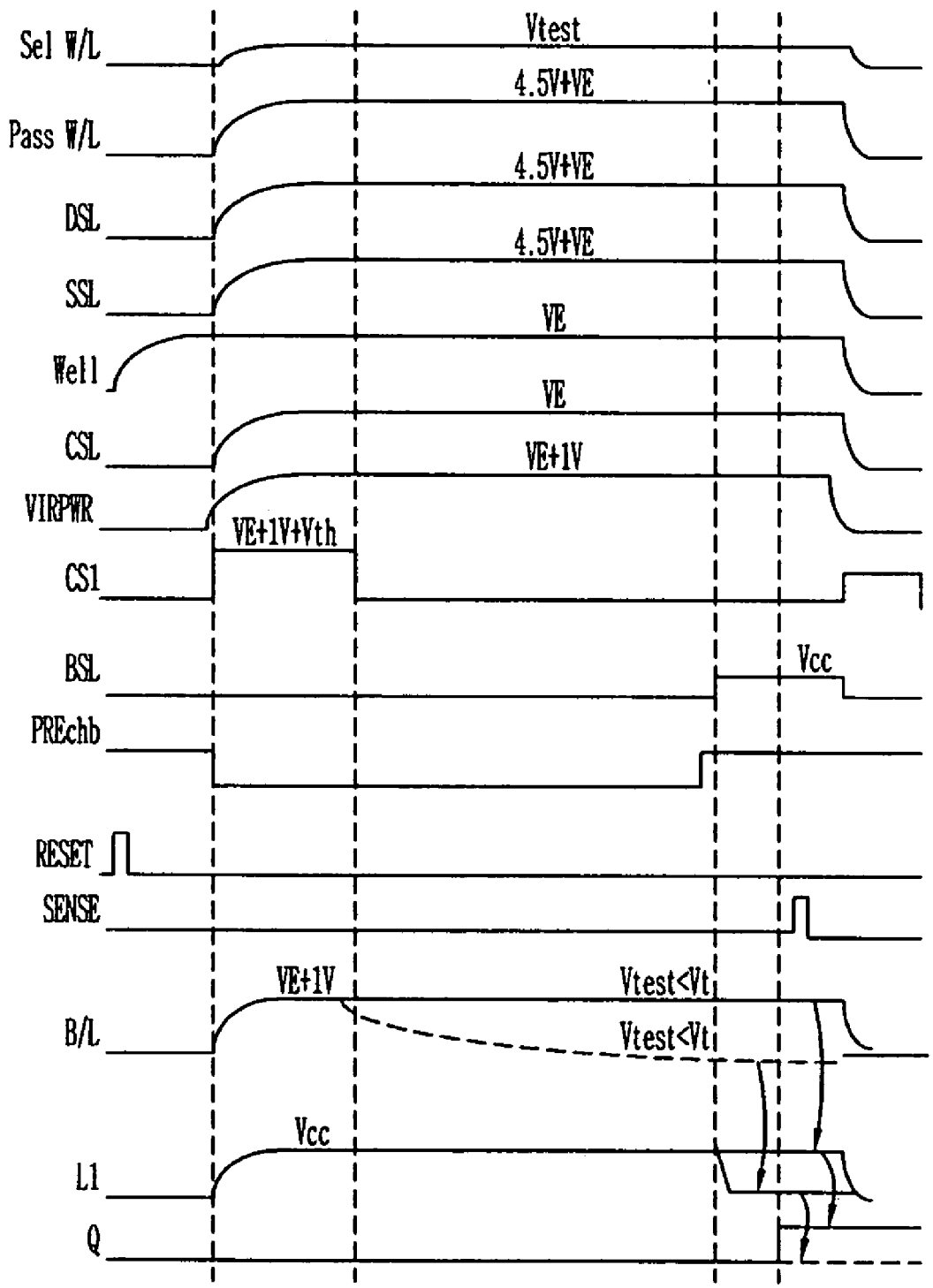
FIG. 3 is a timing diagram of signals at nodes in the flash memory device in accordance with the present invention.

FIG. 3 is a timing diagram of signals at nodes in the flash memory device in accordance with the present invention.

Referring to FIGS. 2 and 3, the page buffer 200 functions to read data from the memory cell and to apply a voltage to the bitline B/L in accordance with program data. In the NAND flash memory device, operations for reading data out of a memory cell to the page buffer 200 and for programming a memory cell in accordance with data loaded in the page buffer 200 are contemporaneously carried out for a plurality of pages, e.g., N in number. On the distribution profiles of threshold voltages of NAND flash memory cells, erased cells have negative threshold voltages while programmed cells have positive threshold voltages.

First, in order to evaluate threshold voltages of programmed cells, the test voltage Vtest higher than 0V is applied to a wordline of a selected memory cell, Sel W/L, and then a read operation is carried out to measure a threshold voltage.

In detail, the first latch L1 of the page buffer 100 is reset to "0" and the test voltage Vtest is applied to the wordline Sel W/L of a selected memory cell. The voltage summing up the pass voltage Vpass of 4.5V and the operation voltage VE is applied to wordlines of deselected memory cells, Pass W/L. The deselected memory cells act as pass transistors for the selected memory cell. The voltage summing the pass voltage Vpass and the operation voltage VE must have a sufficient voltage level because a high voltage over 10V is applied to the wordline W/L during a program mode.

The first control signal CS1 is enabled to provide the voltage summing up the precharge voltage Vpre and the operation voltage VE to the bitline B/L. It is desired to apply a high voltage over the first voltage of the page buffer 200 by using a node discharging the bitline B/L in response to a discharging signal (i.e., the first control signal) CS1. The operation voltage VE is also applied to the common source line CSL and the well.

While evaluating a memory cell for a predetermined time, if a threshold voltage of the selected memory cell is lower than the test voltage Vtest, a voltage of the bitline B/L decreases because a current pass is formed from the bitline B/L and the source line CSL. When a voltage lower than the precharge voltage Vpre is applied to the bitline B/L, a precharged voltage is discharged through the bitline B/L and the initial value "0" of the latch L1 is maintained although the sensing signal SENSE is enabled. In other words, even when the precharge enable signal Prechb becomes logically high to make a voltage, which has been applied to the first node Q1, be floated and a voltage value at a node of the bitline B/L is applied to the first latch L1 by the bitline selection signal BSL and the second control signal CS2, the first latch L1 retains its initial value that is logically low "0" without change.

Meantime, when a threshold voltage of a selected memory cell is higher than the test voltage Vtest, there is no current pass toward the bitline B/L and thereby a voltage of the bitline B/L maintains the voltage summing up the precharge voltage Vpre and the operation voltage VE. At this time, although a voltage lower than the voltage summing up the precharge voltage Vpre and the operation voltage VE is applied thereto, the bitline B/L does not change and data of the first latch L1 changes to "1" when the sensing signal SENSE is enabled.

Thus, a voltage, which is obtained by subtracting the operation voltage VE from the test voltage Vtest applied thereto at an instant when the data of the first latch L1 changes to "1", becomes a threshold voltage of a memory cell in a program mode. It is available to proceed the process for measuring threshold voltages of programmed memory cells without applying the operation voltage VE. With the manner aforementioned, it is possible to obtain distribution profiles by each evaluating memory cells of the flash memory device.

It is preferred for the first control signal CS1 to be active with a voltage higher than the voltage summing up the precharge voltage Vpre and the operation voltage VE by a threshold voltage Vth of the second NMOS transistor N2, which prevents a voltage drop by the second NMOS transistor N2.

Next, in order to evaluate threshold voltages of erased memory cells, the test voltage Vtest higher than 0V is applied to a wordline Sel W/L of a selected memory cell and then a read operation is carried out to measure a threshold voltage. It is preferable to increase a voltage level after completing a read operation with the test voltage Vtest of 0V.

In evaluating an erased memory cell, the first latch L1 of the page buffer 200 is set to logically low "0". And then, predetermined voltages are applied to deselected wordlines Pass W/L, bitlines B/L, and the common source line CSL. From reading cell data of the page buffer 200 with increasing the test voltage Vtest by a predetermined voltage level, a threshold voltage of an erased memory cell is detected when the cell data changes to "1" from "0". It is preferred to apply the test voltage Vtest over 0V to the wordline Sel W/L of a selected cell while to apply voltages, that is increased by the operation voltage VE, to the wordlines Pass W/L of the deselected cells, the common source line CSL, the bitlines B/L, and the well.

Thereafter, the first PMOS transistor P1 is turned on by the precharge enable signal Prechb to supply the first voltage to the first node Q1. From a variation of a voltage applied to the bitline B/L in accordance with the bitline selection signal BSL and the second control signal CS2, a data change of the first latch L I is detected to evaluate a threshold voltage of an erased memory cell.

Figure 4:
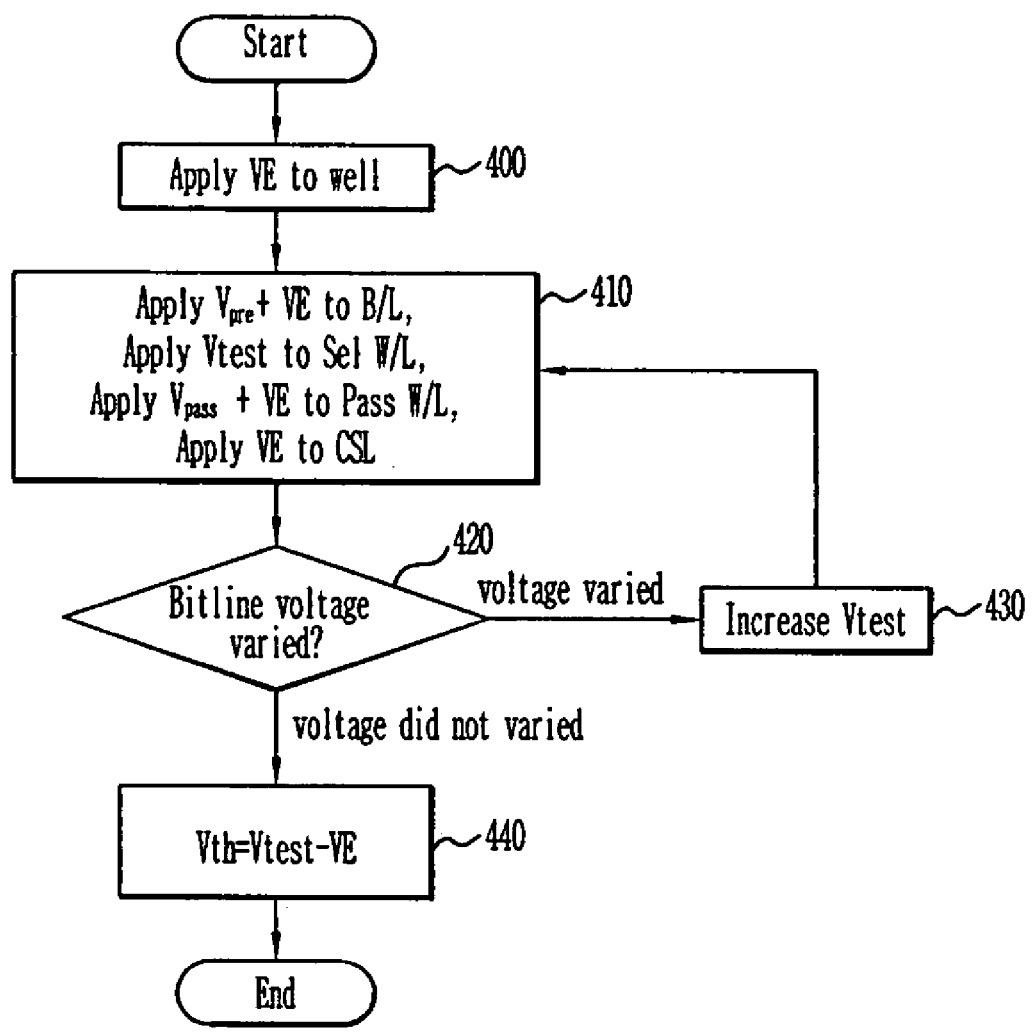
FIG. 4 is a flow chart showing the method for measuring threshold voltages in accordance with the present invention.

Preferably, considering the bitline signal shown in FIG. 4, if a threshold voltage of a selected memory cell is lower than the value obtained by subtracting the operation voltage VE from the test voltage Vtest (Vth<Vtest−VE), a current path is formed from the bitline B/L to the common source line CSL to result in a decrease of a voltage of the bitline B/L. Otherwise, if a threshold voltage of a selected memory cell is higher than the value obtained by subtracting the operation voltage VE from the test voltage Vtest (Vth>Vtest−VE), a current path does is not formed from the bitline B/L to the common source line CSL to retain a voltage of the bitline B/L on the precharge voltage.

FIG. 4 is a flow chart showing the method for measuring threshold voltages in accordance with the present invention.

Referring to FIGS. 3 and 4, the operation voltage VE is applied to the well of the flash memory device (step 400). When the first control signal CS1 goes to logical-high, the voltage summing up the precharge voltage Vpre and the operation voltage VE, Vpre+VE, is applied to the bitline (step 410). Also in the step 410, the test voltage Vtest is applied to a wordline of a selected memory cell while the voltage summing up the pass voltage Vpass and the operation voltage VE, Vpass+VE, is applied to wordlines of deselected memory cells, and the operation voltage VE is applied to the common source line CSL. The first control signal CS1 falls down to logical-low after a predetermined time, i.e., after completing the bitline with the voltage Vpre+VE summing up the precharge voltage and the operation voltage. It is preferred for the first control signal CS1 to have a voltage level summing up the precharge voltage, the operation voltage, and the threshold voltage of the NMOS transistor N2. As the wordline is charged with a high voltage I0V through 20V for programming, it is adaptable to apply a voltage summing up the operation voltage and the test voltage or the pass voltage into the wordline. The well and the common source line are also comprised of passes to be easily acceptable with high voltages. For the purpose of supplying the voltage summing up the precharge voltage and the operation voltage into the bitline, it is preferably available to apply the operation voltage through the virtual power input terminal to initiate the bitline, which arises from because it is difficult to apply a high voltage the precharge node of the page buffer.

After establishing the latch of the page buffer on "0", the bitline selection signal BSL and the sensing signal SENSE are applied to detect a variation of a bitline voltage (step 420). During this, is a bitline voltage has been changed, it resumes the detecting step for bitline voltage variation after increasing the test voltage Vtest by a predetermined level (step 430). On the other hand, there is no variation on a bitline voltage, a threshold voltage of the selected memory cell is regarded to as the voltage, Vtest−VE, obtained by subtracting the operation voltage VE from the test voltage Vtest (step 440).

The process for measuring the cell threshold voltages is terminated by inhibiting voltage supplies to nodes or discharging the voltages applied thereto.

Figure 5:
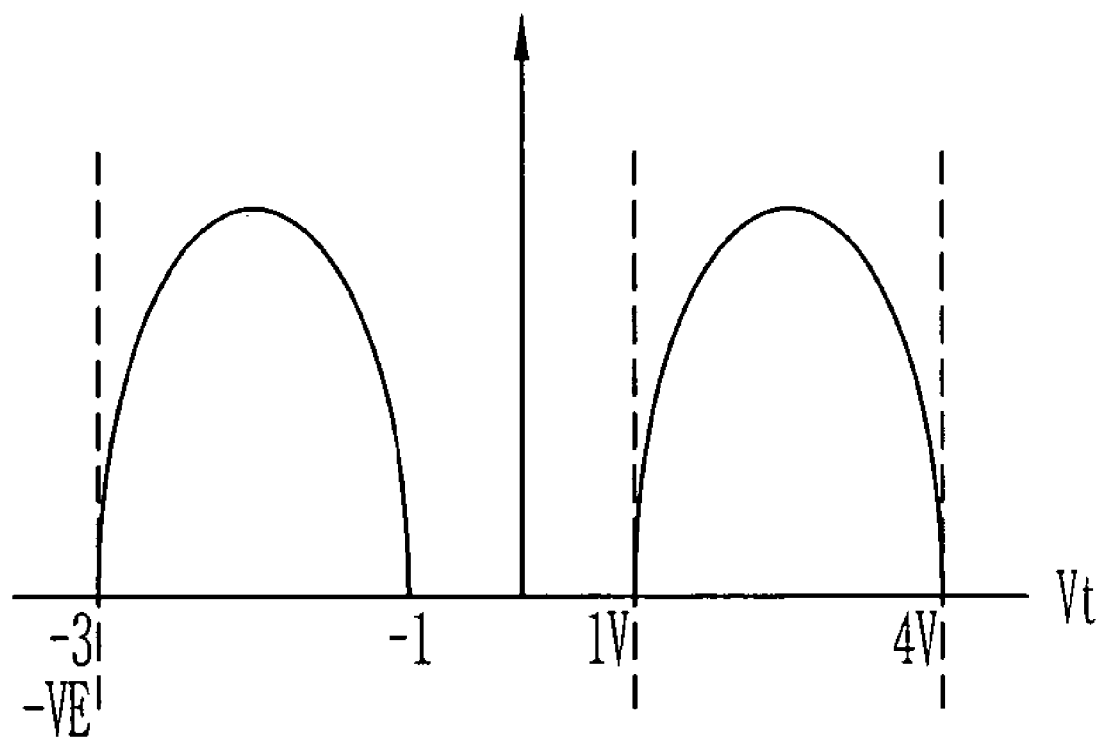
FIG. 5 is a graphic diagram illustrating distribution profiles of threshold voltages in the flash memory device, obtained from the method of measuring threshold voltages in accordance with the present invention.

FIG. 5 is a graphic diagram illustrating distribution profiles of threshold voltages in the flash memory device, obtained from the method of measuring threshold voltages in accordance with the present invention.

Referring to FIG. 5, threshold voltage of programmed memory cells are disposed approximately in the positive voltage range of 1V through 4V, while those of erased memory cells in the negative voltage range of −3V through −1V. It is proper, therefore, for the operation voltage to be established on 3V, that is an absolute value of −3V, in measuring a threshold voltage of a memory cell in the flash memory device.

As described above, the present invention provides an efficient method of measuring threshold voltages of memory cells by detecting voltage variations on bitlines, for which a test voltage is applied to a wordline of a selected memory cell while a voltage summing up a pass voltage and an operation voltage is applied to wordlines of deselected memory cells, and the operation voltage is applied to a well and a common source line while a voltage summing up a precharge voltage and the operation voltage is applied to a bitline.

Moreover, it is possible to evaluate negative threshold voltages even with positive voltages by conditioning a threshold voltage to be estimated in a voltage value obtained by subtracting the operation voltage from the test voltage.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A method of measuring threshold voltages in a NAND flash memory device including a plurality of cell strings each having a plurality of memory cells connected in series, common drain nodes of the cell strings, common source nodes of the cell strings, wordlines for selecting the memory cells, and a well of a semiconductor substrate in which the memory cell is formed, the method comprising the steps of:
   applying an operation voltage to the well and the common source nodes;
   applying a test voltage, which is assigned to measure a threshold voltage, to the wordline of a selected memory cell;
   applying a voltage, which is obtained by summing up a pass voltage and the operation voltage, to the wordlines of deselected memory cells;
   applying a voltage, which is obtained by summing up a precharge voltage and the operation voltage, to the common drain node; and
   detecting a variation of voltage at the common drain node.

2. The method according to claim 1, wherein the test voltage is 0V through 10V; the operation voltage is 3V through 4V; the pass voltage is 4V through 6V; and the precharge voltage is 1V through 2V.

3. The method according to claim 2, wherein the voltage obtained by summing up the precharge voltage and the operation voltage is applied to the common drain node through a virtual power input terminal to initiate the common drain node.

4. A method of measuring threshold voltages in a NAND flash memory device including a plurality of cell strings each having a plurality of memory cells connected in series, a plurality of bitlines connected to common drain nodes of the cell strings, a common source line connected to common source nodes of the cell strings, wordlines intersecting the bitlines so as to select the memory cells, and a well of a semiconductor substrate in which the memory cell is formed, the method comprising the steps of:
   applying an operation voltage to the well;
   applying a voltage, which is obtained by summing up a precharge voltage and the operation voltage, to the bitline, applying a test voltage to a selected wordline, applying a voltage, which is obtained by summing up a pass voltage and the operation voltage, to deselected wordlines, and applying the operation voltage to the common source line; and
   identifying, after detecting a voltage variation of the bitline during a read operation, a threshold voltage of a selected memory cell as a value obtained by subtracting the operation voltage from the test voltage when there is no voltage variation on the bitline, while increasing the test voltage by a predetermined level when the voltage of the bitline decreases.

5. The method according to claim 4, wherein the test voltage is 0V through 10V; the operation voltage is 3V through 4V; the pass voltage is 4V through 6V; and the precharge voltage is 1V through 2V.

6. The method according to claim 5, wherein the voltage obtained by summing up the precharge voltage and the operation voltage is applied to the common drain node through a virtual power input terminal to initiate the common drain node.

* * * * *